(12) United States Patent
Jonoshita

(10) Patent No.: US 7,291,227 B2
(45) Date of Patent: Nov. 6, 2007

(54) PROCESSING EQUIPMENT

(75) Inventor: Akira Jonoshita, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/831,284

(22) Filed: Apr. 26, 2004

(65) Prior Publication Data

US 2004/0211360 A1   Oct. 28, 2004

(30) Foreign Application Priority Data

Apr. 24, 2003  (JP) .............................. 2003-120507

(51) Int. Cl.
*B05B 15/02* (2006.01)
*B05B 15/04* (2006.01)
*B05B 15/12* (2006.01)

(52) U.S. Cl. .......................... 118/302; 118/326; 118/52

(58) Field of Classification Search ............... 118/52, 118/612, 300, 319, 320, 302, 58, 326; 239/104–108, 239/120–122, 498–504, 214; 454/50–57
See application file for complete search history.

(56) References Cited

U.S. PATENT DOCUMENTS

| 5,273,192 A | 12/1993 | Kamiya |
| 5,374,312 A * | 12/1994 | Hasebe et al. ................ 118/52 |
| 5,772,764 A * | 6/1998 | Akimoto ...................... 118/319 |
| 5,849,084 A * | 12/1998 | Hayes et al. ................ 118/320 |
| 5,939,130 A * | 8/1999 | Shiraishi et al. ............... 427/9 |

FOREIGN PATENT DOCUMENTS

| JP | 5-6845 | 1/1993 |
| JP | 2002-204992 | 7/2002 |
| JP | 2002204992 A * | 7/2002 |

OTHER PUBLICATIONS

English Translated Abstract JP 2002204992 A.*

* cited by examiner

*Primary Examiner*—Yewebdar Tadesse
(74) *Attorney, Agent, or Firm*—Volentine & Whitt, P.L.L.C.

(57) ABSTRACT

A processing equipment includes a chamber, an airflow generator which generates a downward airflow in the chamber, a stage in the chamber, a nozzle which is arranged above the stage. The nozzle has a protector which is arranged around a supply port of the nozzle. The protector protects the supply port form the downward airflow.

18 Claims, 7 Drawing Sheets

PROCESSING EQUIPMENT

CROSS REFERENCE TO RELATED APPLICATION

A claim of priority under 35 U.S.C. §119 is made to Japanese Patent Application No. 2003-120507, filed Apr. 24, 2003, which is herein incorporated by reference in its entirety for all purposes.

BACKGROUND OF THE INVENTION

1. Field of the Invention

The present invention relates to a processing equipment with a nozzle.

2. Description of the Related Art

A conventional processing equipment for a semiconductor wafer includes a chamber, an airflow generator for generating a downward airflow, a stage for mounting a semiconductor wafer, and a nozzle for supplying a photoresist to the semiconductor wafer.

The photoresist is supplied from the nozzle to the semiconductor wafer. The supplied photoresist is extended to the entire surface of the semiconductor wafer by rotating the semiconductor wafer. As a result, a photoresist layer is formed on the semiconductor wafer.

Since the semiconductor wafer is rotated, a part of the photoresist which is supplied on the semiconductor wafer flies off the semiconductor wafer as mist photoresist. The airflow generator generates the downward airflow in the chamber for making the mist of the photoresist flow downward.

However, during the photoresist supplying step, photoresist may remain on a supply port of the nozzle. The remaining photoresist may then become hardened by exposure to the airflow. The hardened photoresist may then fall on the semiconductor wafer. If the hardened phoresist falls on the semiconductor wafer, the photoresist layer may be formed non-uniformly on the semiconductor wafer.

To solve this problem, a technique has been known whereby the remaining photoresist is removed when the nozzle is not operated. Such technique is disclosed in Japanese Patent Laid-Open No. 2002-204992.

However, exposing the nozzle to the downward airflow increases the chances of hardening the photoresist. The hardened photoresist might fall on the semiconductor wafer, while the photoresist supplying process is performed.

SUMMARY OF THE INVENTION

Accordingly, in one aspect of the present invention, a processing equipment for reducing an hardened photoresist on the nozzle is provided. The processing equipment includes a chamber, an airflow generator which generates a downward airflow in the chamber, a stage in the chamber, a nozzle which is arranged above the stage. The nozzle has a protector which is arranged around a supply port of the nozzle. The protector protects the supply port from the downward airflow.

DETAILED DESCRIPTION OF THE PREFERRED EMBODIMENTS

Figure 1:
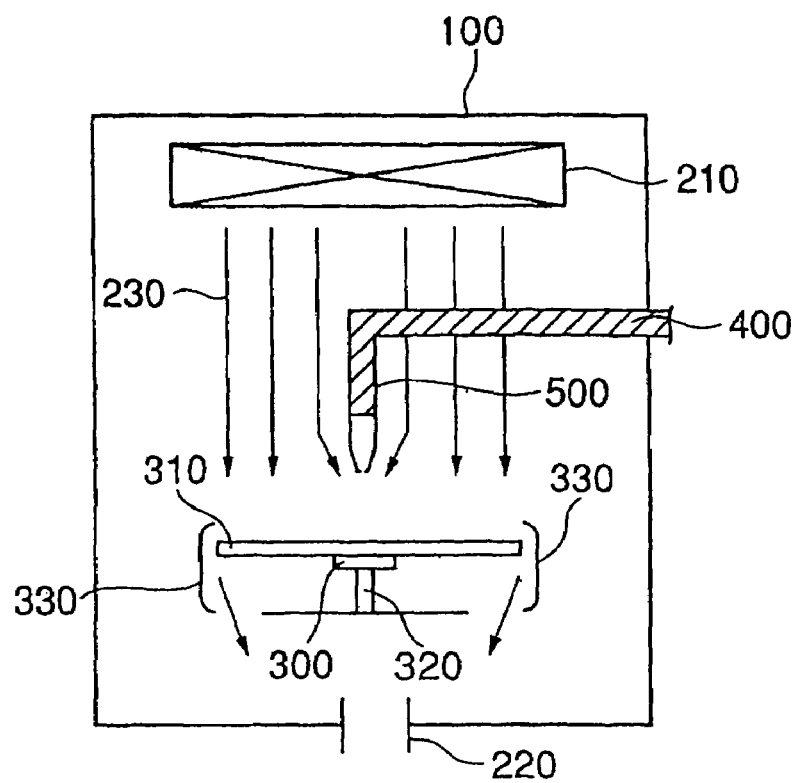
FIG. 1 is a cross-sectional view showing processing equipment of a first embodiment of the present invention.

Processing equipment according to preferred embodiments of the present invention will be explained hereinafter with reference to the accompanying figures. In order to simplify the explanation, like elements are given like or corresponding reference numerals. Dual explanations of the same elements are avoided.

Figure 2:
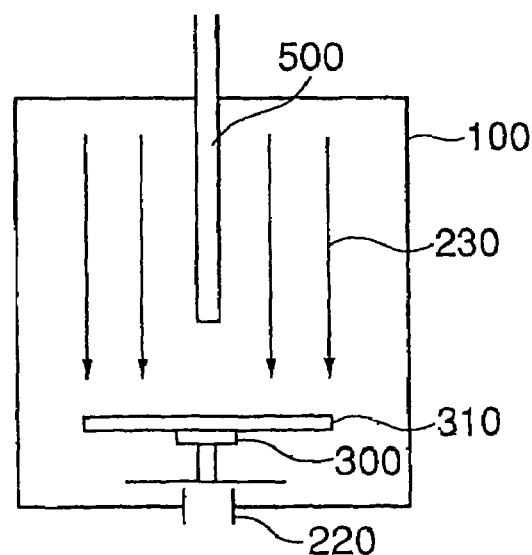
FIG. 2 is a cross-sectional view showing processing equipment of a first alternative embodiment of the present invention.
Figure 3:
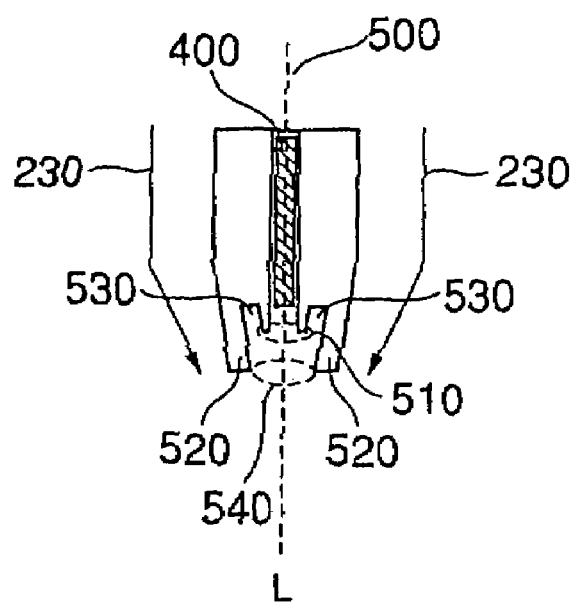
FIG. 3 is a cross-sectional view showing a lower end of the nozzle of the present invention.
Figure 4:
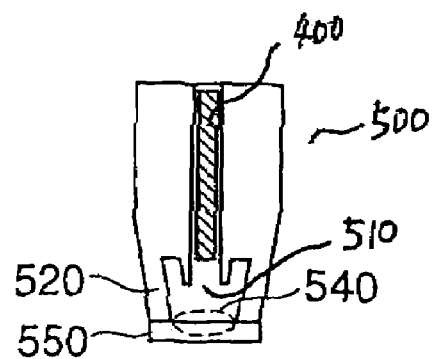
FIG. 4 is a cross-sectional view showing a lower end of the nozzle of the alternative embodiment of the present invention.

FIG. 1 is a cross-sectional view showing processing equipment of a first embodiment of the present invention. FIG. 2 is a cross-sectional view showing processing equipment of a first alternative embodiment of the present invention. FIG. 3 is a cross-sectional view showing a lower end of the nozzle 500 of the present invention. FIG. 4 is a cross-sectional view showing a lower end of the nozzle 500 of the alternative embodiment of the present invention.

The processing equipment includes a chamber 100 and an airflow generator which generates a downward airflow 230 in the chamber 100. The airflow generator includes an air filter 210 formed in the upper portion of the chamber 100 and an exhaust port 220 formed in the lower portion of the chamber 100.

Air is supplied from outside of the chamber 100 to the air filter 210. The air flows to the bottom of the chamber 100. The air is exhausted from the exhaust port 220. As a result, downward airflow 230 is generated.

A stage 300 for mounting a semiconductor wafer 310 thereon and a nozzle 500 for supplying a photoresist 400 on the semiconductor wafer 310 are formed in the chamber 100. In this embodiment, the stage 300 is a spin chuck with vacuum contact.

The stage 300 is connected to a rotational drive shaft 320. The semiconductor wafer 310 is mounted on a top surface of the stage 300 and is held on the stage 300 by vacuum contact. The semiconductor wafer 310 is rotated so as to keep the top surface of the semiconductor wafer in a horizontal position.

The nozzle 500 supplies the photoresist 400 on the semiconductor wafer 310. The photoresist 400 supplied on the semiconductor wafer 310 is extended to the entire surface of the semiconductor wafer 310 by rotating the semiconductor wafer 310. As a result, a photoresist layer is formed on the semiconductor wafer 310. Also, redundant photoresist on the semiconductor wafer 310 is removed by this rotation.

A spin cup 330 is arranged around the semiconductor wafer 310. The spin cup 330 catches photoresist flies off from the rotated semiconductor wafer 310. A part of the flying photoresist turns to mist form. The mist flows downward by force of the downward airflow 230 and is exhausted through the exhaust port 22. As a result, adhesion of the mist on the semiconductor wafer 310 is reduced.

The nozzle 500 has a protector 520 around a supply port 510 as shown in FIG. 3. The protector 520 protects the supply port 510 from the downward airflow 230. As a result, the protector 520 inhibits exposure of the supply port 510 to the downward airflow 230.

The nozzle 500 is inserted from the side surface of the chamber 100 and extended in the chamber 100 so that the supply port 510 is arranged above the spin chuck 300. That is, the nozzle extends in a horizontal direction from the side surface of the chamber 100 to above the spin chuck 300, and is bent at above the spin chuck 300 so that the supply port 510 faces to the spin chuck 300.

Alternatively, the nozzle 500 can be inserted from a top surface of the chamber 100 as shown in FIG. 2. That is, the nozzle can be arranged along the downward airflow 230. If the nozzle is inserted from the top surface of the chamber 100, the nozzle 500 does not block the downward airflow 230.

In this embodiment, a level of a lower end of the protector 520 is lower than a level of the supply port 510. Therefore, a chance that the supply port 510 is exposed to the downward airflow 230 is reduced. As a result, since the supply port 510 is not exposed to the downward airflow 230, the chances that the photoresist becomes hardened are reduced.

Further, the protector 520 is formed away from the supply port 510. That is, there is a space 530 between the supply port 510 and the protector 520. According to the space 530, a chance that the photoresist 400 is dropped from the inner wall of the protector 520 is reduced.

The protector 520 has an opening in the low end of the protector 520 so that the opening has size enough for supplying the photoresist 400 from the supply port 510 to the semiconductor wafer 310. Therefore, adhering of the photoresist 400 in the protector 520 can be inhibited.

An upper portion of the protector 520 is closed for preventing downward airflow 230 within nozzle 500. However, a small opening can be formed in the upper portion of the protector 520, as long as airflow is not generated inside the protector 520 by the small opening.

The lower end of the protector 520 is tapered. Therefore, the downward airflow 230 flows smoothly along the low end of the protector 520. As a result, insertion of the downward airflow 230 into the protector 520 can be inhibited.

Alternatively, a cap 520 can be formed at the lower end portion of the protector 520 as shown in FIG. 4. When a photoresist supplying operation is not operated, the cap 550 is closed. Therefore, the chances of exposing the supply port 510 to the downward airflow 230 is reduced.

Figure 5:
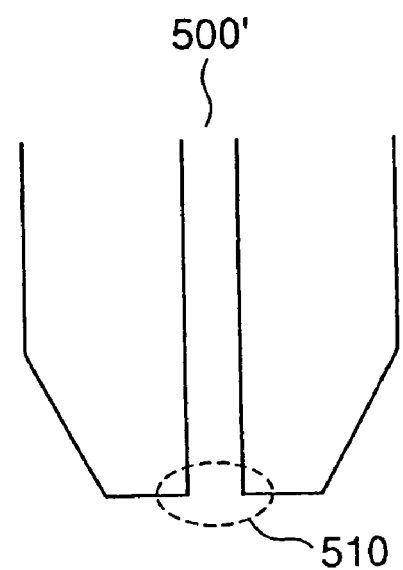
FIG. 5 is a cross-sectional view showing a nozzle before a cutting operation is performed.
Figure 6:
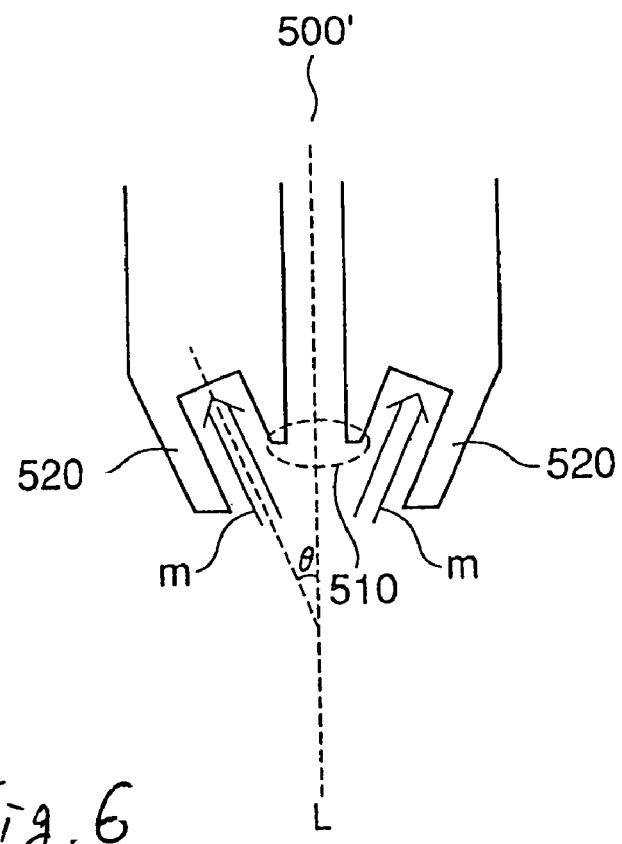
FIG. 6 is a cross-sectional view showing the cutting operation of the nozzle.
Figure 7:
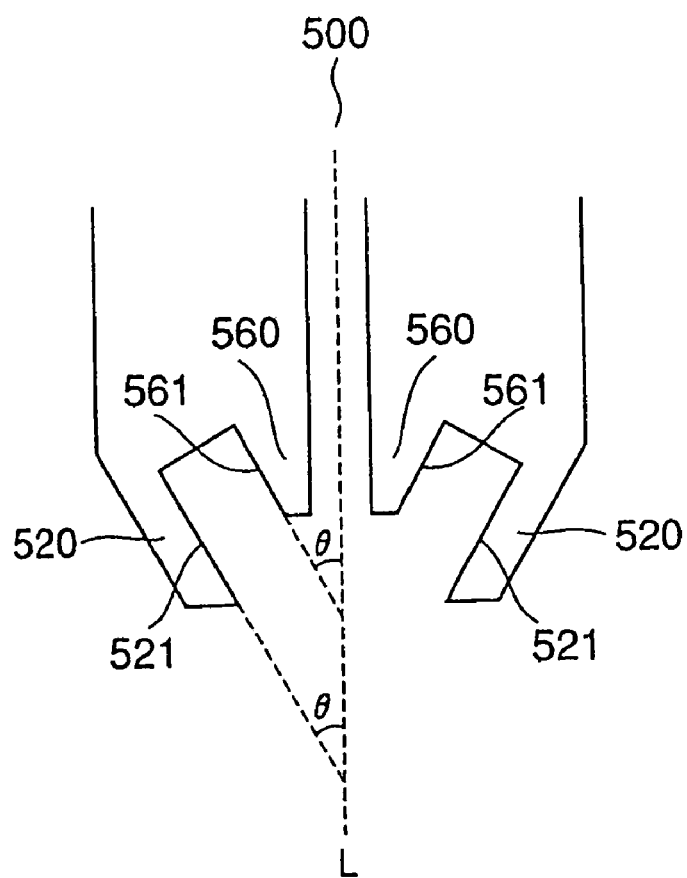
FIG. 7 is a cross-sectional view showing the nozzle after the cutting operation is performed.

Next, a method of fabricating the nozzle is described. FIG. 5 to FIG. 7 are cross-sectional views showing a nozzle forming steps.

First, the nozzle 500' shown in FIG. 5 is formed by injecting a resin in a mold. The nozzle 500' has the supply port 510. Then, the protector 520 is formed by cutting a lower end of the nozzle 500'. The cutting operation is performed with an angle θ from a centerline L. As a result, a part of the lower end of the nozzle 500' becomes the protector 520, as shown in FIG. 6.

After the cutting operation, the protector 520 and a supply portion 560 are formed as shown in FIG. 7. An inner surface 521 of the protector 520 and an outer surface 561 of the supply portion 560 are formed in parallel. That is, both of the inner surface 521 of the protector 520 and the outer surface 561 of the supply portion 560 are formed with the angle θ from the centerline L. In this embodiment, the nozzle 500' is made by of resin for ease of the cutting operation.

Next, a processing operation of the semiconductor wafer is described by using FIG. 8 to FIG. 11.

Figure 8:
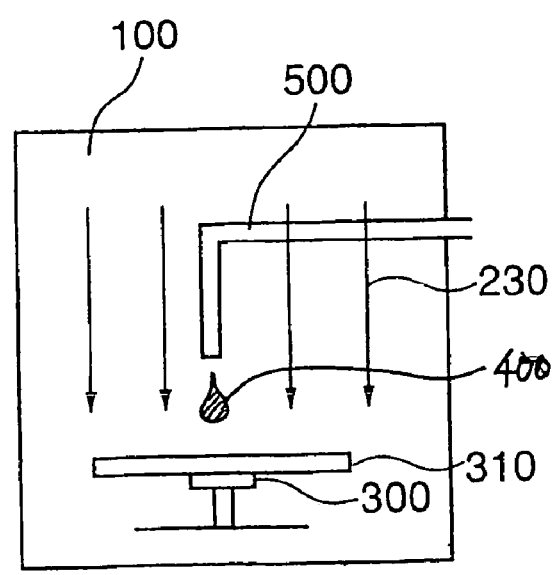
FIG. 8 is a cross-sectional view showing downward airflow in the processing equipment of the present invention.

First, the semiconductor wafer 310 is mounted on the stage 300 and is vacuum held thereto as shown in FIG. 8. Then, the downward airflow 230 is generated in the chamber 100.

Figure 9:
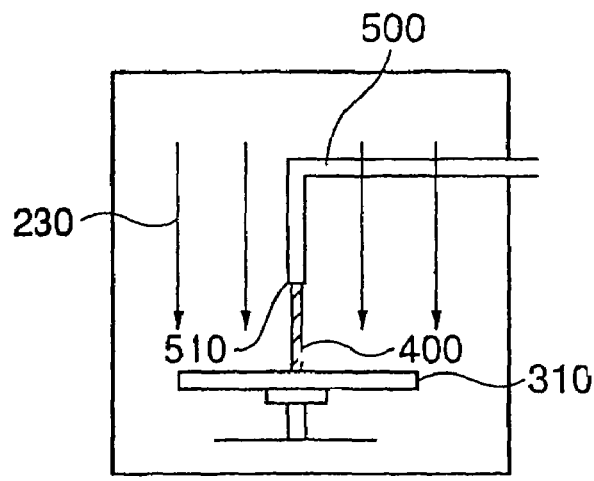
FIG. 9 is a cross-sectional view showing a photoresist supplying step in the processing chamber of the present invention.
Figure 10:
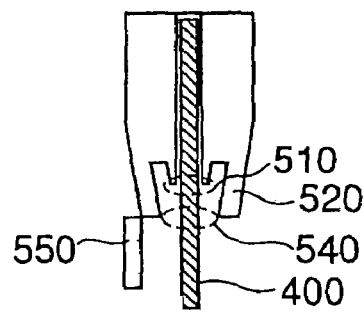
FIG. 10 is a cross-sectional view showing the nozzle of the alternative embodiment of the present invention.

Then, the photoresist 400 is supplied on the top surface of the semiconductor wafer 310 from the nozzle 500 as shown in FIG. 9. If the nozzle 500 has the cap as shown in FIG. 4, the photoresist 400 is supplied after the cap is opened as shown in FIG. 10.

Figure 11:
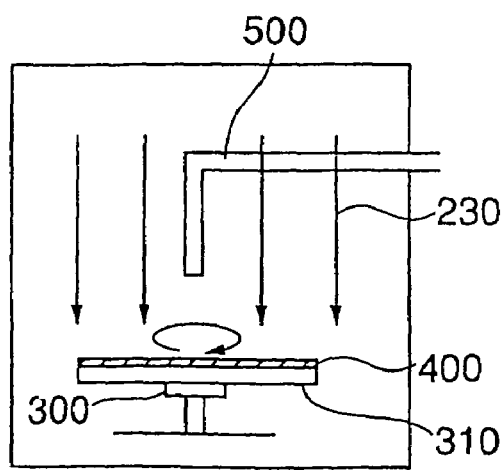
FIG. 11 is a cross-sectional view showing the processing equipment after the photoresist is supplied.
Figure 12:
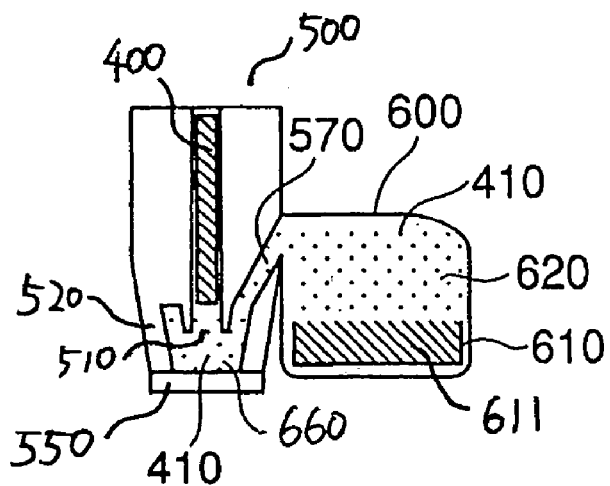
FIG. 12 is a cross-sectional view showing a nozzle of a second embodiment of the present invention.

Then, the stage 300 is rotated to expand the photoresist 400 which is supplied on the semiconductor wafer 310 to the entire surface of the semiconductor wafer 310, as shown in FIG. 11. As a result, a photoresist layer is formed on the semiconductor wafer 310.

FIG. 12 to FIG. 15 are cross-sectional views showing a nozzle 500 of a second preferred embodiment. A space 660 which is inside of the protector 520 is filled by gas 410 made of solvent 611 of the photoresist 400. Thinner can be used as the solvent 611.

The processing equipment of the second embodiment includes a pot 600 filled by the gas 410. The pot 600 includes a solvent area 610 in which is put the solvent 611 of the photoresist 400 and a gas area 620 which is filled by the gas such as thinner made by the solvent 611.

The pot 600 is formed on a side wall of the nozzle 500. The gas area 620 of the pot 600 is coupled to the space 660 via a through hole 570. Accordingly, the photoresist 400 adhered at the supply port 510 is dissolved by the gas 410, so that the chances the photoresist 400 hardening is reduced.

The nozzle 500 has the protector 520 for protecting the space 660 from the downward airflow 230. As a result, a chance that the gas 410 runs out from the space 660 is reduced. That is, the gas 410 is kept in the space 660 when the nozzle 500 is exposed to the downward airflow 230.

Figure 13:
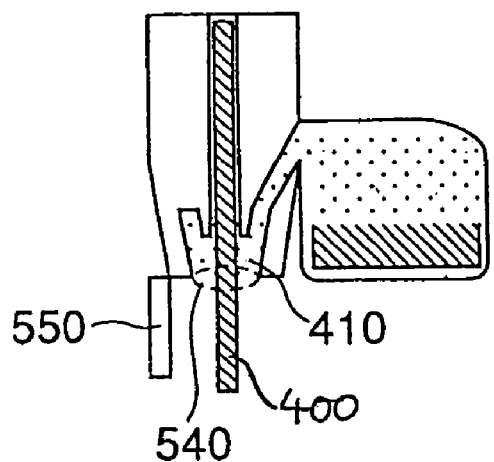
FIG. 13 is a cross-sectional view showing the nozzle of a second embodiment of the present invention.

The nozzle 500 has the cap 550 at the lower end of the protector 520. When the photoresist 400 is supplied from the supply port 510, the photoresist 400 is supplied after the cap 550 is opened as shown in FIG. 13. The cap 550 is useful for keeping the gas 410 in the space 660.

Figure 14:
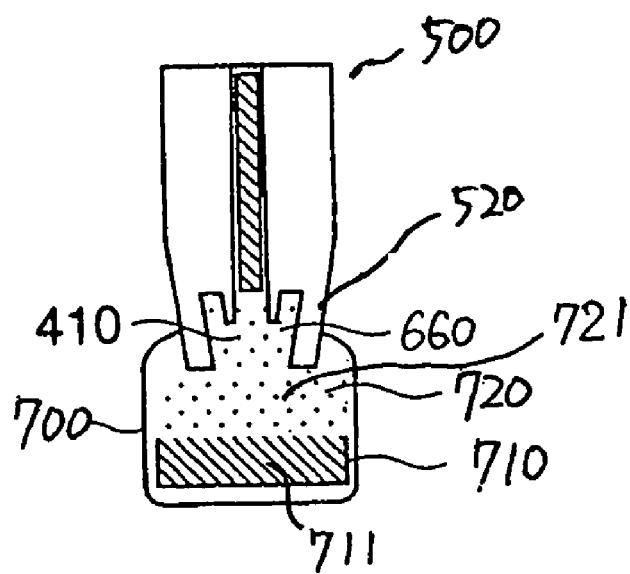
FIG. 14 is a cross-sectional view showing an alternative of the nozzle of the second embodiment of the present invention.
Figure 15:
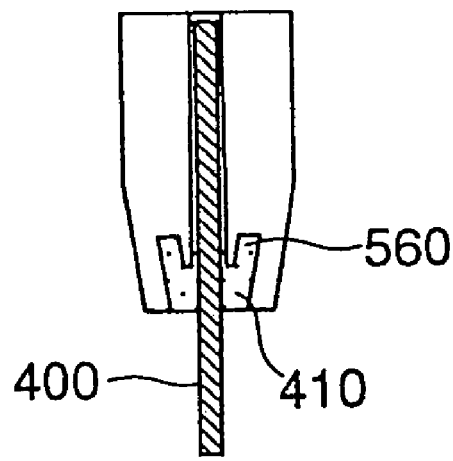
FIG. 15 is a cross-sectional view showing the dispensing of photoresist by the nozzle of the alternative second embodiment of the present invention.

Alternatively, if the through hole 570 cannot be formed in the nozzle 500, the space 660 can be filled by the gas 410 as shown in FIG. 14. In this method, a separable pot 700 is prepared. The separable pot 700 includes a solvent area 710 in which is put the solvent 711 of the photoresist 400 and a gas area 720 which is filled by the gas 721 such as thinner made by the solvent 711. The pot 700 is contacted to the end portion of the nozzle 500 before a photoresist supplying operation. As a result, the space 660 is filled by the gas 410.

When the nozzle 500 supplies the photoresist 400, the pot 700 is removed from the end of the nozzle 500. The nozzle 500 has the protector 520 for protecting the space 660 from the downward airflow 230. As a result, a chance that the gas 410 runs out from the space 660 is reduced. That is, the gas 410 is kept in the space 660 when the nozzle 500 is exposed to the downward airflow 230.

While the preferred form of the present invention has been described, it is to be understood that modifications will be apparent to those skilled in the art without departing from the spirit of the invention. The scope of the invention is to be determined solely by the following claims.

What is claimed is:

1. A processing equipment comprising:
   a chamber;
   an airflow generator which generates a downward airflow in the chamber;
   a stage which has a top surface, wherein the stage is provided in the chamber; and
   a nozzle which has a supply port, wherein the supply port is arranged above the stage and is provided in the chamber, and wherein the nozzle has a lower sidewall that extends integrally from the nozzle, that is tapered, and that surrounds the supply port,
   the nozzle further including a protector formed integrally as part of the nozzle, the protector having a tapered lower end that surrounds the lower sidewall of the nozzle, that protects the supply port from the downward airflow, wherein the tapered lower end of the protector extends beyond the lower sidewall in a direction substantially along the downward airflow and wherein an inner surface of the protector is arranged to be parallel with the tapered lower sidewall of the nozzle.

2. The processing equipment of claim 1, further comprising a cap at the tapered lower end of the protector.

3. The processing equipment of claim 1, wherein the chamber includes a top wall, wherein the nozzle extends from the top wall of the chamber.

4. The processing equipment of claim 3 wherein the nozzle is introduced through the airflow generator.

5. The processing equipment of claim 1, wherein the protector is made by cutting operation.

6. The processing equipment of claim 1, wherein the stage is rotatable.

7. The processing equipment of claim 6, wherein the stage includes a vacuum chuck.

8. The processing equipment of claim 7, wherein the nozzle is used for supplying a photoresist to a semiconductor wafer which is mounted on the stage.

9. The processing equipment of claim 1, further comprising a container which is filled with a solvent of a solution supplied from the nozzle, and wherein the solvent is supplied to the supply port of the nozzle from the container.

10. The processing equipment of claim 9, wherein the container is detachably mounted to the tapered lower end of the protector.

11. The processing equipment of claim 1, wherein the airflow generator is arranged above the nozzle so that an outer surface of the protector of the nozzle is exposed to the downward airflow.

12. A processing equipment comprising:
    a chamber;
    an airflow generator which generates a downward airflow in the chamber;
    a wafer stage on which a semiconductor wafer is mountable;
    a nozzle which includes a supply port and a protector, wherein the supply port has a lower sidewall that extends integrally from the nozzle, the supply port supplies a photoresist to the semiconductor wafer mountable on the wafer stage, and wherein the protector is formed integrally as part of the nozzle, has a tapered lower end and surrounds the lower sidewall of the supply port; and
    a container detachably mounted to the tapered lower end of the protector and having a photoresist solvent contained therein, so that the supply port is exposed to the photoresist solvent.

13. The processing equipment of claim 12, wherein the nozzle is arranged to extend in a direction along the downward airflow.

14. The processing equipment of claim 12, further comprising a cup located around the semiconductor wafer.

15. The processing equipment of claim 12, wherein the stage is rotatable.

16. The processing equipment of claim 12, wherein the lower sidewall of the supply port is tapered.

17. The processing equipment of claim 16, wherein the tapered lower end of the protector extends beyond the lower sidewall of the supply port in a direction substantially along the downward airflow and wherein an inner surface of the protector is arranged to be parallel with the tapered lower sidewall of the supply port.

18. The processing equipment of claim 12, wherein the airflow generator is arranged above the nozzle so that an outer surface of the protector of the nozzle is exposed to the downward airflow.

* * * * *